July 7, 1970 W. P. WATERS ET AL 3,518,751

ELECTRICAL CONNECTION AND/OR MOUNTING ARRAYS FOR INTEGRATED CIRCUIT CHIPS

Filed May 25, 1967

2 Sheets-Sheet 1

Richard J. Belardi,
Warren P. Waters,
INVENTORS.
BY.
W Hunt Alleston Jr.
ATTORNEY.

July 7, 1970 W. P. WATERS ET AL 3,518,751

ELECTRICAL CONNECTION AND/OR MOUNTING ARRAYS FOR INTEGRATED CIRCUIT CHIPS

Filed May 25, 1967 2 Sheets-Sheet 2

United States Patent Office 3,518,751

Patented July 7, 1970

3,518,751

ELECTRICAL CONNECTION AND/OR MOUNTING ARRAYS FOR INTEGRATED CIRCUIT CHIPS

Warren P. Waters, Corona del Mar, and Richard J. Belardi, Anaheim, Calif., assignors to Hughes Aircraft Company, Culver City, Calif., a corporation of Delaware Filed May 25, 1967, Ser. No. 641,325
Int. Cl. B01j *17/00;* H01i *1/16*
U.S. Cl. 29—577 7 Claims

ABSTRACT OF THE DISCLOSURE

An integrated circuit chip having a first array of fixed connection pads and provided with a second array of connection pads conforming to some predetermined desired pattern different from the pattern of the first array, the connection pads of the second array being electrically connected to respective ones of the first array and electrically insulated from other portions of the circuit chip.

This invention relates to integrated circuitry or microcircuitry components and the like and particularly to methods for providing external electrical connections thereto in any desired pattern irrespective of the original and usually unchangeable connection pattern of the circuitry itself.

It is well known, particularly in the semiconductor art, to fabricate in a single body of semiconductor material, for example, a plurality of active and/or passive electronic or electrical circuit elements which are electrically interconnected to one another to perform one or more specified circuit functions. Typical circuit elements formed and connected in this fashion are diodes, transistors, resistors and capacitors. Interconnections are usually formed by conductive paths laid down on the surface of an electrically insulating layer on a semiconductor body or substrate so as to connect the desired portions or ones of the active and/or passive circuit elements. It is conventional to form this interconnection network by first applying metal as by vacuum deposition over the entire surface of the semiconductor body or substrate and then by means of photographic masking and etching procedures remove the metal so as to leave portions thereof where desired and connected in such a fashion or pattern as to achieve the necessary circuit function or functions. Metal is also retained on relatively large areas to permit the circuit or circuits to be connected to external apparatus. Such large areas are hereinafter referred to as circuit connection areas or pads. The assembly comprising the substrate with one or more circuit elements or circuits integrated therewith is referred to herein as a "circuit chip" and is usually quite small. A typical computer circuit performing the function of a shift register, for example, is disposed on and/or in a silicon chip .048" x .068" x .006" in size. Such circuit chips may be received from the manufacturer thereof as a plurality of identical chips still integral with each other on a common semiconductor wafer which is subsequently diced to yield discrete circuit chips.

It will be understood the user of such microcircuitry has the problem of making the ultimate connections to the connection pads of the circuit chip so as to achieve some predetermined electrical or system function. It will be understood also that while the same circuit, in a functional sense, may be purchased from different manufacturers in chip form, the pattern of circuit connection areas or pads for external hook-up is usually different and far from standard due principally to the uniqueness of each manufacturing design and masking. Such nonuniformity of connection pads is also characteristic, of course, for functionally different circuit chips. It therefore remains for the user to often incorporate not only functionally different circuits but also functionally identical circuits from the different sources, all in chip form and all having differently patterned connection pads, into equipment with the minimum amount of expense and labor and with the maximum amount of uniformity.

It is therefore an object of the present invention to provide an improved method for making electrical connections to integrated circuitry components.

Another object of the invention is to provide an improved method for making electrical connections to electrical apparatus having a plurality of connection means disposed thereon.

Still another object of the invention is to provide an improved method for providing electrical apparatus such as integrated circuitry components having a fixed array of electrical connection means disposed thereon with a predetermined or standardized array of electrical connections.

These and other objects and advantages of the invention are realized by providing a second array of additional connection areas in a standard predetermined pattern on an integrated circuit chip with the second array being electrically insulated therefrom and electrically connected to selected ones of the electrical connection areas or pads already existing on the integrated circuit chip. This second array may then be utilized to bond the circuit chip to a module substrate, for example, having electrical connection means thereon corresponding to the aforesaid standard pattern of the second array. It is also possible to provide the second array of connection pads with the means to achieve such bonding (as by discretely positioned solderable elements, for example).

The invention will be described in greater detail by reference to the drawings in which.

Figure 1:
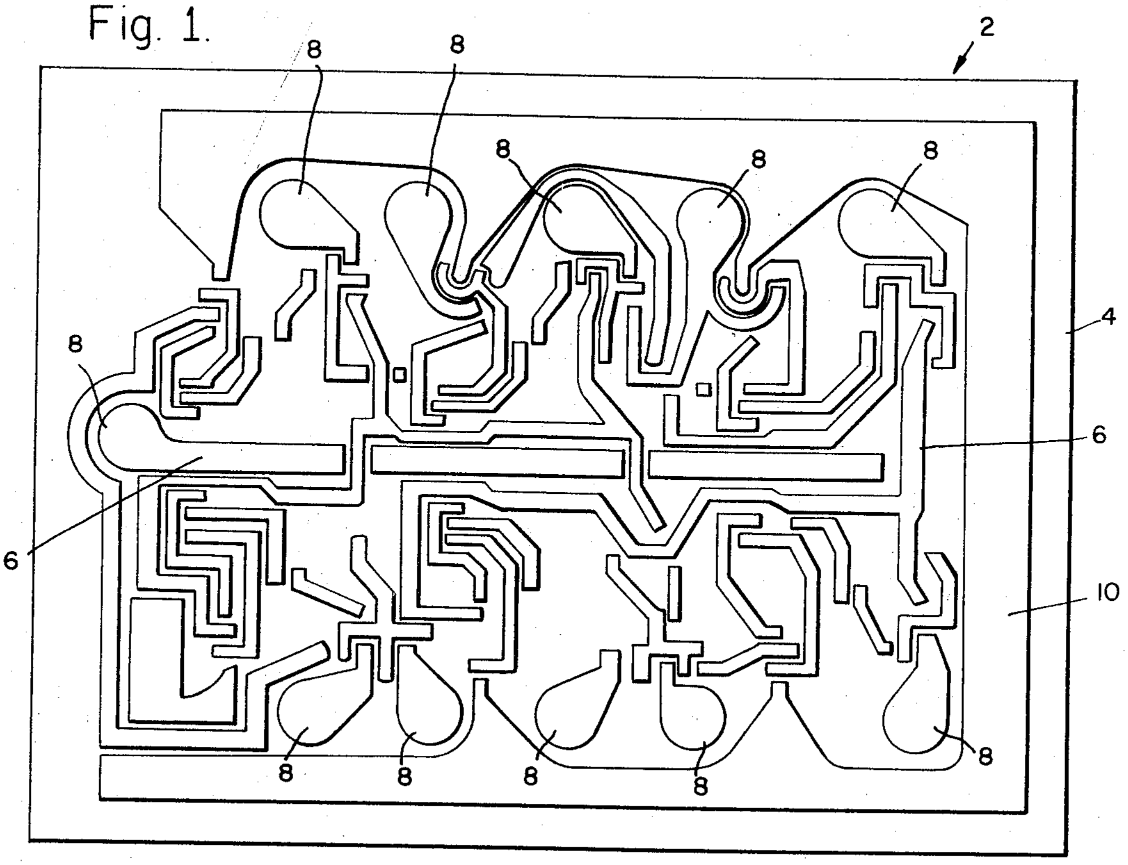
FIG. 1 is a plan view of an integrated circuit chip having a plurality of pre-arranged electrical connection areas thereon.

Referring now to FIG. 1, an integrated circuit chip 2 is shown comprising a substrate 4 of silicon, for example, in which have been fabricated a plurality of electrical elements or components (not shown) such as transistors, diodes and resistors, for example. Typically, this circiut ship may be the shift register circuit mentioned previously. Disposed on the surface of the silicon chip 4 is a plurality of electrical leads 6 connected to the various electrical elements and terminated in relatively large area connection pads 8. As is well known in the art of integrated circuitry, these leads 6 and connection pads 8 may be in the form of vacuum-deposited strips or areas of metal disposed on and bonded to an underlying coating 10 of electrically insulating material, such as silicon dioxide, except where electircal conections to the various terminals of the electrical components are desired. As presented to the user, this chip 2 thus has an upper surface comprising metallic areas (6 and 8) and areas 10 of electrically insulating material and all that remains to permit the circuit to be operated is to make the desired necessary connections thereto via the large area connection pads 8. Since this chip is to be mounted on some type of support such as a larger substrate or circuit module member, the design of the substrate module to receive such a chip must be such as to accommodate the pattern of large area connection pads 8 disposed on the chip by the manufacturer thereof. As noted previously, there would be little or no problem in accomplishing such mounting if the pattern of conection areas were standard for all such circuit chips except perhaps for such problems as achieving a desired alignment spacing between bonding contacts and the like. Since, however, the connection patterns are unique not only for particular manufacturers but also for particular circuits, the user, if he desires to purchase and use the same circuit chip as far as electrical function is concerned from more than one manufacturer or source, must adapt his equipment (module substrates) to meet the differing conection patterns. The same design diversity and complexity is faced when one desires to use a mixture of different electrically functioning chips. The present invention permits the user of such circuit chips to overcome these problems of design diversity in a simple, convenient and inexpensive manner, and to design for himself a standard connection member capable of receiving and mounting circuit chips having almost any connection pattern. At the same time, the user has the opportunity to meet any particular alginment spacing requirements for bonding contracts and the like.

To accomplish this desirable end according to the invention, the first step is to provide the fixed array of connection pads 8 on the circuit chip 2 with an overlying protective coating of electrically insulating material such as glass through which holes may be formed to expose underlying portions of the connection pads 8. This may be accomplished by sputtering glass over the surface of the chip and then by conventional photoresist etching techniques remove portions of the glass to form holes therein to the conection pads 8.

Figure 2:
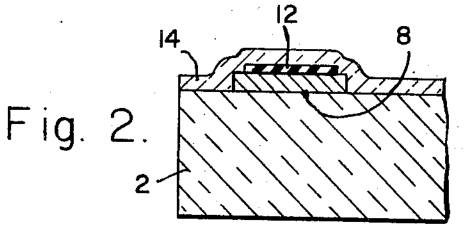
FIGS. 2–5 are elevational, cross-sectional views of a portion of the integrated circuit chip shown in various succeeding stages of processing according to the invention.

Another procedures is to first provide the connection pads 8 with an overlying coating of polymeric material 12 as shown in the portion of the circuit chip 2 in FIG. 2. Advantageously, these areas 12 of polymeric material may be formed by conventional photoresist techniques as is well known in the art. Briefly, this technique involves applying photosensitive polymeric material over the entire surface of the circiut chip 2 and then exposing this coating to light as through an optical mask so that only areas of the polymeric material over the large area connection pads 8 are exposed to the light and thereby insolubilized and/or polymerized. Thereafter, by special solvents available for the purpose, the unexposed, soluble areas of the polymeric material are removed leaving the exposed polymeric material in place on the connection pads 8 or on some predetermined portion thereof and usually less than the whole. Typically suitable solvents for this purpose may be one such as methyl, ethylketone or trichloroethylene.

Thereafter, a layer 14 of glass is formed as by vapor-deposition or sputtering over the entire surface of the circuit chip 2 including the polymeric areas 12 as well as the metal in connection strips thereon. Holes may be provided in the glass layer 14 over the underlying connection areas 8 by the methods disclosed in the copending application of Joseph F. Hlista entitled "Method for Providing Holes in Glass," Ser. No. 635,087, filed May 1, 1967. According to teaching in this copending application, there are two techniques available to provide the desired holes. First, the circuit chip 2 may be immersed in a solution which dissolves the underlying polymeric material 12. A suitable solution for this purpose may be one of the aforementioned solvents except that longer times may now be required to effect removal of the polymeric material as by softening the same. The removal may be enhanced by agitation. The solution is able to reach and react with these polymeric areas 12 notwithstanding the coating glass 14 thereover by one of several procedures. Since the glass is sputtered or vapor-deposited on the surface from above the circuit chip 2, very little or no glass is deposited on lateral surfaces of the polymeric surfaces 16. Hence, these lateral surfaces may be reached by the solution so as to remove same and thus free the overlying glass portion. Also, the surface of the glass over such polymeric areas has been found to be discontinuous or porous as denoted by the wrinkled appearance thereof. Such porosity permits the solution to reach the glass and reach the polymeric material and dissolve the same so that the glass comes loose with it.

Alternatively, the circuit chip 2 may be placed in an oven and heated in an oven to a temperature that causes the polymeric 12 to further polymerize, preferably to the point of charring. Such heating results in causing the polymeric material to expand and in effect mechanically "pop" the overlying glass free from the surface. By allowing the polymeric material to char, its removal is facilitated as by standard cleaning procedures such as by rinsing and scrubbing in water, for example.

Figure 4:
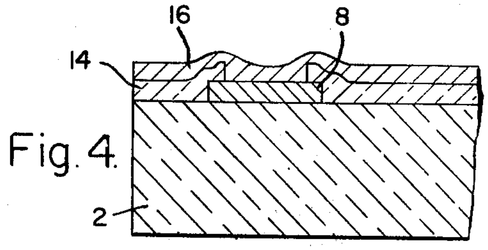
Figure 3:
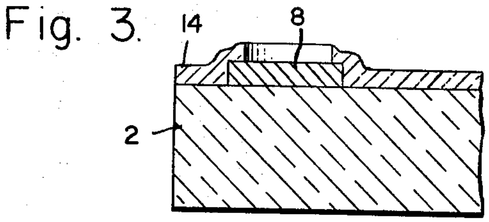
Figure 5:
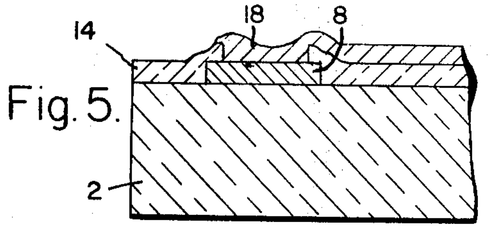
Figure 7:
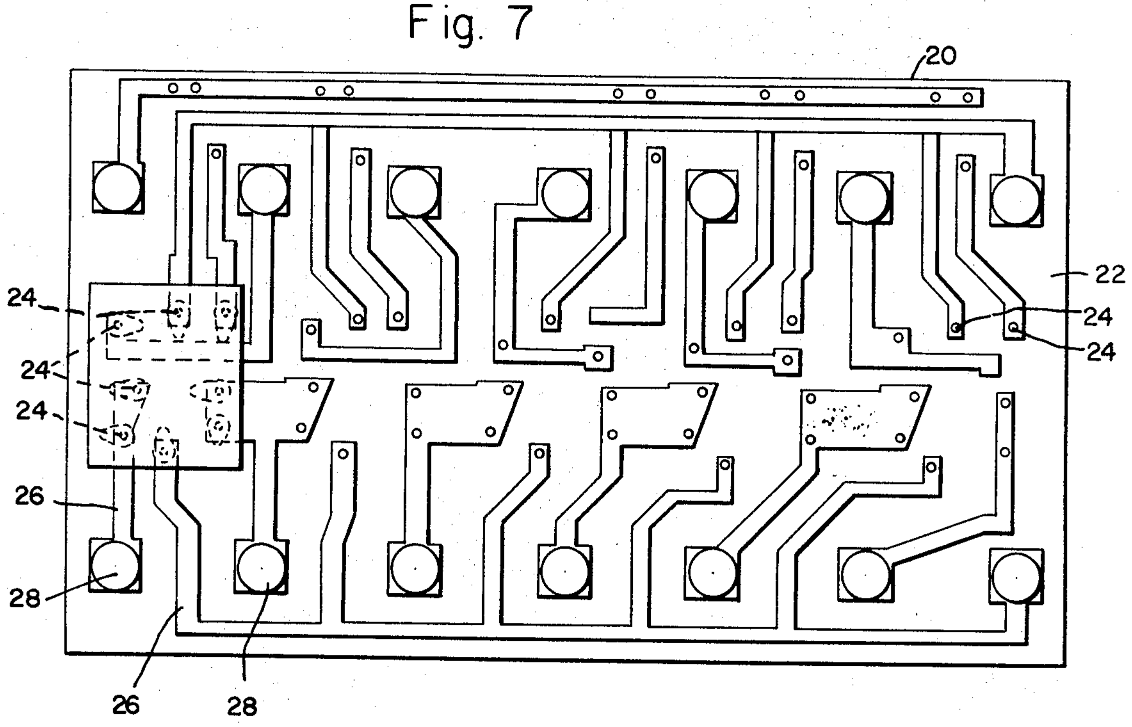
FIG. 7 is a plan view of a standard substrate module having mounted thereon an integrated circuit chip processed according to the invention to leave an array of conection areas conforming to the array of conection means on the substrate.

Referring to FIG. 3, a portion of the circuit chip 2 is shown upon the completion of the above processing and comprising the circuit chip 2 having a layer of glass 14 over the entire surface except at predetermined portions thereof. As shown in FIG. 4, the next step is to apply as by vacuum-deposition a layer 16 of electrically conductive material or metal such as aluminum, for example, over the entire surface of the circuit chip 2 and specifically entirely over the glass layer 14 and the portions of the connection pads 8 exposed threrethrough. The final step is to remove portions of the metal layer 16 to form secondary connection pads 18 in the position, size and geometry desired to accommodate some predetermined pattern as on a standard module substrate (such as shown in FIG. 7 which will later be described in greater detail). In effect, this processing has resulted in providing the circuit chip 2 with connection areas which conform in geometry and position with the contact portions of the user's standard substrate. The formation of this secondary array of connection pads 18 may be accomplished by standard photoresist etching procedures known in the art. It may also be desirable to provide discrete bonding elements (not shown) such as a solder bump on the various connection pads by electroplating according to the techniques taught in the copending application of Reissmueller et al., Ser. No. 511,780, filed Dec. 12, 1965, now U.S. Pat. No. 3,408,271 and assigned to the instant assignee.

One of the chief ancillary advantages of the process of the invention is the capability of forming ultimate connection areas (18) which are relatively thick in comparison with the primary connection areas (8) which, due to the smallness, number and complexity of the circuit chip, often are quite thin and less than eminently satisfactory for making strong metallurgical bonds thereto. Typically, the thickness of the primary array of connection areas 8 may be about 6000 A.; the thickness of the glass protective layer 14 may be about 2 micrometers; and the thickness of the secondary connection pads 18 may be 2–5 micrometers, for example.

Figure 6:
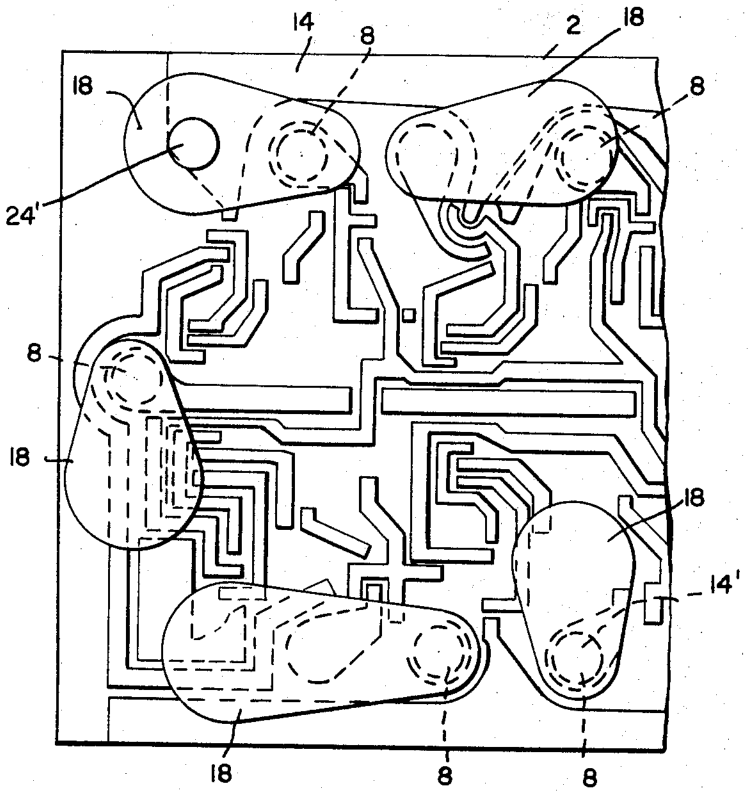
FIG. 6 is a plan view of the integrated circuit chip of FIG. 1 as processed according to the invention.

In FIG. 6, a plan view of a portion of the circuit chip 2 processed thus far according to the invention is shown. As noted, the entire surface of this chip is now covered with a protective layer 14 of glass on portions of which are disposed the secondary connection pads 18 arranged so as to conform to a standard contact arrangement on an interconnecting substrate member (shown in FIG. 7). The secondary connection pads 18 are in electrically conducting relationship with the primary connection pads 8 which in FIG. 6 are shown in dotted or dashed lines underlying the secondary connection pads 18. Likewise indicated by dashed lines, the holes 14′ through the glass layer 14 are shown underlying the secondary connection areas 18. It will be appreciated that any disposition or arrangement of secondary connection pads is possible according to the user's needs and desires. Thus it is possible to now extend the connection pads over circuit areas of the chip 2 from which they are insulated by the glass layer 14, permitting them to be larger than when disposed directly on the silicon chip itself (since it is desired to utilize the mazimum area of the silicon chip for device purposes).

Referring now to FIG. 7, a typical interconnection module or substrate member 20 is shown and may comprise a substrate 22 of glass or other suitable insulating material on a surface of which is bonded a plurality of primary contact members 24 and interconnection strip portions 26 which eventually terminate in a plurality of secondary contact members 28. These primary and secondary contact members 24 and 28, respectively, may be in the form of metallic bumps or vacuum-deposited metal pads, for example, formed according to the bump plating process described in greater detail in the aforementioned copending U.S. application of Reissmueller et al. As noted previously, the contact members 24' may be provided on the connection pads 18 of the circuit chip 2 and dispensed with on the module substrate member 20, if desired. The primary contacts or solder bumps 24 are designed to provide bonding as by ultrasonic bonding or soldering or by thermocompression bonding between the secndary connection areas 18 of the circuit chip 2 and the corresponding portions 24 of the module substrate 20. The secondary contacts or bumps 28 are designed to facilitate bonding as by soldering or welding to external lead wires.

The final step as indicated in FIG. 7 is to mount the circuit chip 2 on the predetermined desired portions of the module substrate 22 so that the secondary connection areas 18 on the circuit chip contact the appropriate contacts 24 (or 24' as the case may be) on the module substrate 22. After or before, if desired, the circuit chip or chips have been mounted on the module substrate and bonded thereto as aforesaid, lead wires 30 may be connected to the secondary contacts or bumps 28 and the integrated circuit chip is then ready for use. It may be desirable to coat the entire assembly comprising the circuit chip 2—module substrate 22 with a plastic potting material such as one of the well-known epoxy resins, for example. Alternatively, the assembly may be mounted in any of the hermetically sealed packages well known in the art.

There thus has been described an improved method for mounting integrated circuit chips on module substrates. Among the advantages of the method of the invention is not only the achievement of the use of standardized substrate modules for circuit chips having different terminal or connection patterns but also the attainment of at the same time circuit chips hermetically sealed with glass. In addition, the invention permits metallurgical optimization of the bonding connection means between the circuit chip and the module substrate whereby such bonds are achieved with much thicker metal layers than heretofore which adds to the ultimate strength and ruggedness of the assembly. The user of circuit chips is also given the opportunity to optimize the size, geometry and location of connection areas and contact bumps so as to escape some the low-yielding inducing results of close spacing thereof heretofore characteristic of circuit chip-module assemblies.

What is claimed is:

1. In a method of fixedly mounting an integrated circuit member on a substrate member wherein said integrated circuit member is a completed article of manufacture having a fixed array of external electrical connection elements disposed on one surface thereof and spaced differently from the arrangement of connection elements on said substrate member, the improvement comprising:

(1) forming an adherent and solid layer of electrically insulating protective material over the said one surface of said integrated circuit member and leaving openings therethrough to portions of said electrical connection elements of said fixed array;

(2) coating a second array of discrete metal electrical connection elements on said layer of electrically insulating material corresponding in arrangement to that of said connection elements on said substrate member and electrically connected through said openings in said layer of electrically insulating material to respective ones of said fixed array of connection elements on said integrated circuit member;

(3) relatively engaging said second array of discrete metal elements of said integrated circuit member with corresponding electrical connection elements on said substrate and bonding mechanically and electrically the respective engaged elements.

2. The method according to claim 1 including the step of affixing discrete bonding elements on said second array of electrical connection elements.

3. The method according to claim 1 wherein said connection elements on said substrate member include discrete bonding elements and said integrated circuit member is bonded to said substrate member by said discrete bonding elements.

4. The method of claim 1 wherein the forming step comprises forming an adherent and solid layer of glass.

5. The method of claim 1 wherein said second array of discrete metal electrical connections are coated to be thicker than said external electrical connections elements of said fixed array.

6. The method according to claim 1 wherein said layer of electrically insulating material is glass and said second array of metallic electrical connection elements are formed by vacuum deposition on portions thereof and in said openings therethrough.

7. The method according to claim 5 wherein said discrete bonding elements are affixed to said second array of electrical connection elements by electroplating.

References Cited

UNITED STATES PATENTS

| | | | |
|---|---|---|---|
| 2,890,395 | 6/1959 | Lothrop et al. | |
| 3,138,744 | 6/1964 | Kilby. | |
| 3,374,533 | 3/1968 | Burks et al. | 29—626 XR |

OTHER REFERENCES

IBM Tech. Disclosure Bulletin, vol. 8, No. 3, August 1965, by A. D. Brown.

CHARLIE T. MOON, Primary Examiner

R. W. CHURCH, Assistant Examiner

U.S. Cl. X.R.

29—591, 626, 530, 620, 25.42; 317—101, 234, 258; 174—68.5; 336—198